United States Patent [19]

Bayruns et al.

[11] Patent Number: 5,442,321

[45] Date of Patent: Aug. 15, 1995

[54] AUTOMATIC TRANSIMPEDANCE CONTROL AMPLIFIER

[75] Inventors: Robert J. Bayruns, Middlesex; Timothy M. Laverick, Frankline Park, both of N.J.

[73] Assignee: Anadigics, Inc., Warren, N.J.

[21] Appl. No.: 89,201

[22] Filed: Jul. 8, 1993

[51] Int. Cl.⁶ .......................... H03F 1/34; H03G 3/30
[52] U.S. Cl. .................... 330/282; 330/278; 330/279; 330/133; 330/134
[58] Field of Search ............... 330/278, 279, 282, 133, 330/134

[56] References Cited

U.S. PATENT DOCUMENTS

| | | | |
|---|---|---|---|
| 3,636,463 | 1/1972 | Ongkiehong | 330/278 |
| 4,092,611 | 5/1978 | Frederiksen et al. | 330/261 |
| 4,415,803 | 11/1983 | Muoi | 250/214 |
| 4,455,535 | 6/1984 | Sugawara | 330/278 |
| 4,540,953 | 9/1985 | Togari et al. | 330/279 |
| 4,563,656 | 1/1986 | Baum | 330/308 |
| 4,565,974 | 1/1986 | Smoot | 330/304 |
| 4,574,249 | 3/1986 | Williams | 330/59 |
| 4,608,542 | 8/1986 | Siegel | 330/279 |
| 4,642,453 | 2/1987 | Nordqvist et al. | 250/214 A |
| 4,714,828 | 12/1987 | Bacou et al. | 250/214 |
| 4,764,732 | 8/1988 | Dion | 330/59 |
| 4,855,687 | 8/1989 | Hebert | 330/304 |
| 5,008,524 | 4/1991 | Reutter et al. | 250/214 |
| 5,012,202 | 4/1991 | Taylor | 330/284 |

FOREIGN PATENT DOCUMENTS 2096852A 4/1981 United Kingdom .......... H04B 9/00

OTHER PUBLICATIONS

Jindal, R., "Gigahertz-Band High-Gain Low-Noise AGC Amplifier in Fine-Line NMOS", *IEEE Journal of Solid-State Circuits* SC-22(4): 512-521 (1987).
Pietruszynski et al., "A 50-Mbit/s CMOS Monolithic Optical Receiver", *IEEE Journal Of Solid-State Circuits* 23(4): 1426-1433 (1988).
Scheinberg et al., "Monolithic GaAs Transimpedance Amplifiers for Fiber-Optic Receivers", *GaAs Transimpedance Amplifiers for Fiber-Optic Receivers* 26(12): 1-6 (1991).
Asad Abidi, "Gigahertz Transresistance Amplifiers in Fine Line NMOS", *IEEE Journal of Solid-State Circuits* SC-19(6): 986-994 (1984).

*Primary Examiner*—William L. Sikes
*Assistant Examiner*—Fetsum Abraham
*Attorney, Agent, or Firm*—Pennie & Edmonds

[57] ABSTRACT

An automatic transimpedance control amplifier is disclosed. The amplifier incorporates an automatic gain control circuit which simultaneously and automatically adjust the value of transimpedance and the voltage gain at each gain stage of the amplifier according to the input current. The amplifier has wide bandwidth, high sensitivity, and more importantly, wide dynamic range.

14 Claims, 8 Drawing Sheets

AUTOMATIC TRANSIMPEDANCE CONTROL AMPLIFIER

FIELD OF THE INVENTION

This invention relates to transimpedance amplifiers, and more particularly, to automatic transimpedance control amplifiers.

BACKGROUND OF THE INVENTION

Transimpedance amplifiers are typically utilized to provide output voltage signals proportional to input current signals. Such amplifiers are normally implemented by providing a feedback resistor across the input and output of a voltage amplifier.

Transimpedance amplifiers are used to detect optical signals in optical transmission systems. In these applications, optical signals which are generally transmitted through an optical fiber, are irradiated onto a PIN photodiode or avalanche photodiode which is connected to the input terminal of the amplifier. The photodiode converts the optical signals into currents which is applied to the input of the amplifier. The amplifier thus provides at its output terminal a voltage proportional to the diode current. In optical transmission systems, the information transmitted is usually digital and generally in the form of a pulse train.

In a transimpedance amplifier, the value of the feedback resistor directly relates to the performance of the amplifier. For example, the sensitivity of the transimpedance amplifier is proportional to the value of the feedback resistor, whereas the bandwidth of the amplifier is inversely proportional to the value of the feedback resistor. Additionally, the output voltage of the amplifier is a product of the input current and the value of the feedback resistor, and is thus proportional to the value of the feedback resistor.

The dependency of the amplifier's performance on the value of the feedback resistor presents special problems in utilizing transimpedance amplifiers to detect optical signals in an optical transmission system. In optical transmission applications, it is desirable that the transimpedance amplifiers are fabricated prior to their installation, and that the same transimpedance amplifiers are used for receiving strong optical signals such as in a Local Area Network where the distance of transmission is short as for receiving weaker optical signals in an optical network where the distance of transmission is long.

Thus, in a transimpedance amplifier utilized for optical signal detection, if the value of the feedback resistor is chosen to be high for high optical sensitivity, the bandwidth of the amplifier will be low due to the high value of the feedback resistor. In addition, when applying such transimpedance amplifier for detecting optical signals having high optical power, the high input optical power generates high input current to the amplifier, which in turn produces an output voltage above the output voltage that the amplifier can supply at its output without incurring significant distortion to the output waveform; Consequently, the output waveform becomes distorted and the clipping of the output pulses occurs. For a typical GaAs amplifier, if the peak to peak output voltage exceeds about 1 volt, the output pulse will begin to clip and the amplifier begins to lose its virtual ground at the input terminal of the amplifier.

On the other hand, if the value of the feedback resistor is selected to be low for high bandwidth and large dynamic range (i.e. being capable to accommodate high input current without resulting in significant distortion to the output waveform), the amplifier will have a low sensitivity which results in high bit error rate at low input current. Additionally, in a transimpedance amplifier, if the value of the feedback resistor is lower than a certain value, the transimpedance amplifier may produce oscillation and become unstable, which sets a lower limit for the value of the feedback resistor.

It is therefor an object of the present invention to provide an automatic transimpedance control amplifier which has a wide bandwidth, high sensitivity, and more importantly, a large dynamic range.

SUMMARY OF THE INVENTION

In accordance with the invention, an automatic transimpedance amplifier comprises an inverting voltage amplifier and a feedback resistance means.

The voltage amplifier comprises a plurality of voltage gain stages, each of the voltage gain stage having an output node and at least one input node, and the gain stages being connected one after another from a first stage to a last stage as a cascade.

The feedback resistance means connects the output node of the last stage to the input node of the first stage.

The transimpedance amplifier further comprises a plurality of variable resistance means, each means having first, second, and control terminals, the resistance between the first and second terminals being variable by applying an electronic signal to the control terminal. Additionally, each said variable resistance means is connected between the output node of one voltage gain stage and the input node of the first stage, with the first terminal of the variable resistance means being connected to the output node of the one stage, and the second terminal being connected to the input node of the first gain stage, whereby a voltage gain of the one stage being controlled by changing the resistance of the variable resistive means.

The transimpedance amplifier further comprises an automatic gain control (AGC) drive circuit having an input node connected to the output node of the last stage, and a plurality of output control nodes, each control node being connected to the control terminal of one variable resistive means.

The AGC drive circuit is responsive to an output voltage at the output node of the last stage, generating at the output control terminals control signals relating to the output voltage.

Furthermore, the drive circuit is responsive to an increased current applied at the input node of said first stage, generating control signals that reduce the resistance of each variable resistance means, thereby reducing voltage gain of each stage as well as an effective feedback resistance.

BRIEF DESCRIPTION OF THE DRAWINGS

These and other objects, features and advantages of the invention will be more apparent from the following detailed description in conjunction with the appended drawings in which.

DETAILED DESCRIPTION

Figure 1:
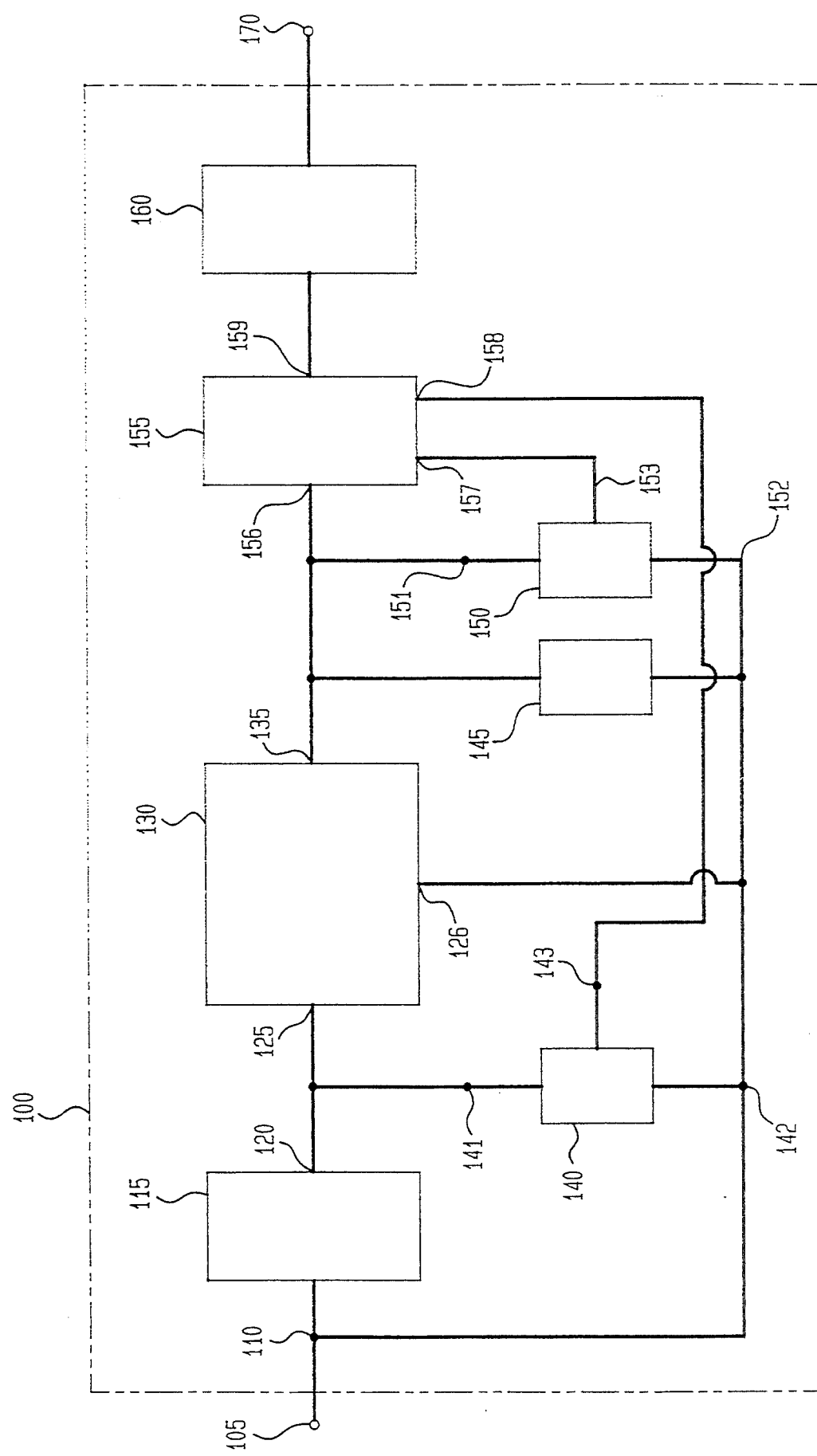
FIG. 1 depicts a schematic block diagram of a first embodiment of an automatic transimpedance amplifier.

In accordance with the invention, an automatic transimpedance control amplifier comprises a plurality of voltage amplifying stages. Each of the voltage amplifying stages has an output node and at least an input node. The amplifying stages are connected one after another in a series, with the at least input node of one stage being connected to the output node of the stage before it, and the output node of the stage being connected to the at least input node of the next stage. A feedback resistance means connects the output node of the last stage to the input node of the first stage is formed.

The amplifier further comprises the same number of variable resistance means as the number of voltage amplifying stages, each variable resistance means has first, second, and control terminals, and the resistance between the first and second terminal being variable by applying electronic signals to the control terminal.

Each of the variable resistance means is connected across an output node of an amplifying stage, with the first terminal connected to the output node of the stage, and the second terminal connected to the input node of the first stage. Thus, the voltage gain of each stage can be modulated by varying the resistance of the variable resistive means.

The amplifier further comprises an Automatic Gain Control (AGC) drive circuit which has an input node connected to the output node of the last stage, and a plurality of output nodes, each of which is connected to a control terminal of a variable resistive means. The AGC drive circuit is responsive to the voltage signal at the output of the last stage, generating control signals which relate to the voltage signal at its output nodes.

The operating principle of the automatic transimpedance amplifier is as follows:

When a low current signal is applied to the input node of the first stage, the AGC drive circuit, responsive to the corresponding output voltage at the output node of the last stage, generates control signals at the control terminals of the variable resistance means so that the variable resistance means displays high resistance. Consequently, each amplifying stage operates at its near maximum voltage gain condition, and the effective feedback resistance is substantially at the maximum value. As a result, the ATCA displays high sensitivity which is especially desirable for detecting low input current.

When the input current signal is high, the AGC drive current generates control signals that reduces the resistance of the variable resistance means. As a result, the voltage gain of each amplifying stage as well as the effective feedback resistance is reduced. The output voltage at the last stage, which is approximate the product of the input current and the effective resistance, is thus controlled to within the operable output voltage, eliminating output voltage waveform distortion. Since the voltage gain of the ATCA is reduced simultaneously with the effective feedback resistance, the ATCA remains stable.

FIG. 1 illustrates the schematic block diagram of a first embodiment of the present invention. In this drawing, an ATCA 100 comprises a first amplifying stage 115, a second amplifying stage 130, a feedback resistance means, an AGC drive circuit 155, and variable resistance means 140 and 153.

First stage 115 is an inverting amplifying stage having an input node 110 connected to an current input terminal 105, and an output node 120 connected to a first input node 125 of second amplifying stage 130.

Second stage 130 is an non-inverting differential amplifier having first input node 125 connected to the output node of the first stage, a second input node 126 connected to input terminal 105, and an output node 135 that is connected an input node 156 of AGC drive circuit 155.

A resistive means 145 is formed between output node 135 of the second stage and input node 110. Variable resistive means 140 and 150 are connected between output 120 of the first stage and input terminal 105, and between output 135 of the second stage and input terminal 105, respectively.

Control terminals 143 and 153 of first variable resistance means 140 and second variable resistance means 150 are connected to output nodes 157 and 158 of the AGC drive circuit, respectively.

Preferably, AGC drive circuit is also a buffer circuit, providing buffered output voltage at its output node 159 that corresponds to the voltage at node 135. Additionally a second buffer circuit 160 is provided, which produces buffered output voltage at 170 for driving external transmission lines.

Figure 2:
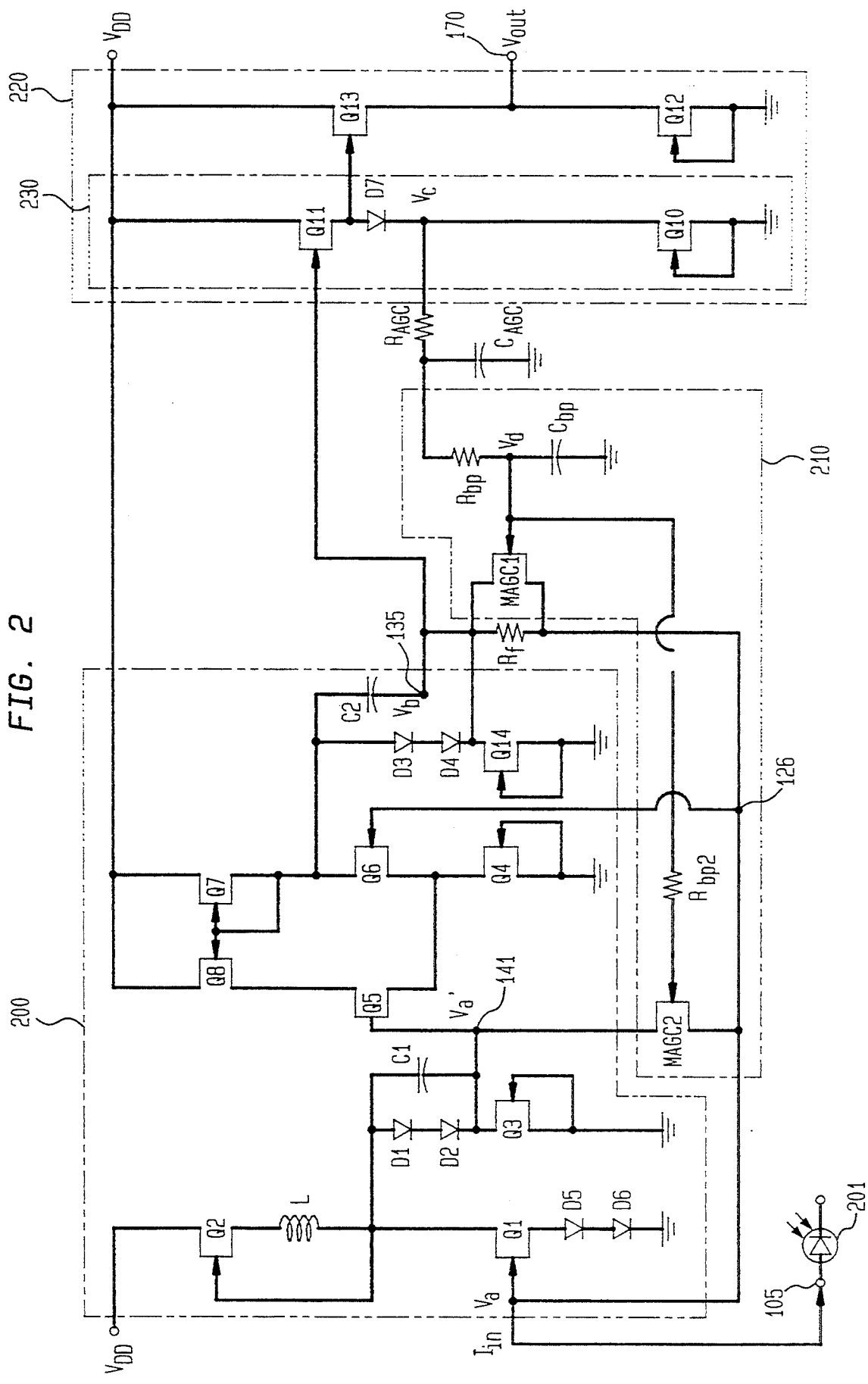
FIG. 2 illustrates a preferred circuit diagram for the embodiment of FIG. 1.

A preferred circuit configuration for the embodiment depicted in FIG. 1 is illustrated in FIG. 2. In this ATCA, all the transistors, i.e. Q1–Q13 are depletion mode GaAs Metal Semiconductor Field Effect Transistors (MESFETs) which require negative gate-source biasing to turn them off. In addition, the circuit requires a single voltage source $V_{DD}=+5$ V as power supply.

The first inverting gain stage comprises MESFETs Q1–Q3, diodes D1, D2, D5, D6, an inductor L and a capacitor C1. Inductor L and MESFET Q2 forms an inductive load for MESFET Q1 to increase gain and reduce noise. The effect of the inductor is explained in detail by Bayruns et al., in "Design of Low Noise Wide Dynamic Range GaAs Optical Preamps", *IEEE Int. Conf. Circuit Syst.*, Singapore, June 1991, which is incorporated herein by reference. Diodes D5 and D6 shift a source voltage of Q1 up two diode bias voltages so that Q1 is properly turned off when Va is at the ground potential. An output voltage of the first gain stage Va' is lower than the drain voltage of Q1 by the sum of two diodes biasing voltages of D1 and D2. A capacitor C1 is formed across the two diodes to reduce the output signal's phase shift due to the first gain stage.

The second differential gain stage which is non-inverting comprises MESFETs Q4–Q8, Q14, and diodes D3 and D4. The first input node of the stage, i.e.

the gate of Q5, is connected to the output of the first gain stage. The second input nodes of the second stage, i.e. the gate of Q6, is conductive linked to the input terminal of the first stage at Va. The connection of the input of the first stage to the gate of Q6 creates a zero in the transfer function at $C1/(R_fC_{gd6})$ where Rf is a feedback resistor and Cgd6 is the gate-to-drain capacitance of MESFET Q6, which greatly enhances the stability of the ATCA (See Scheinberg et al., "Monolithic GaAs Transimpedance Amplifiers for Fiber-Optic receivers", *IEEE J. Solid-State Circuits*, Vol.26, No.12, Dec. 1991).

Feedback resistor Rf is provided between the output node of the second gain stage and the input terminal for providing a feedback. Since the first gain stage is an inverting stage and the second stage is non-inverting stage, resistor Rf provides a negative feedback with respect to the input terminal.

A first automatic gain control field effect transistor MAGC1 is connected in parallel to the feedback resistor Rf. Thus, an effective feedback resistance is the combined resistance of parallel connected Rf and MAGC1; the effective resistance is also regulated by applying voltages to the gate of MAGC1.

Additionally, because MAGC1 connects the output of the second gain stage to the input terminal, by changing MAGC1's source-to-drain resistance, the second stage's load resistance, which includes the contribution from Q14, Rf, and MAGC1, can be altered. Consequently, as well known to those skilled in the art, the voltage gain of the second stage can be controlled by controlling the source-to-drain resistance of MAGC1.

A second automatic gain control field effect transistor MAGC2 connects the output of the first gain stage to the input terminal. By applying a control signal to the gate of MAGC2 and controlling its source-to-drain resistance, the voltage gain of the first gain stage measured at its output node can thus be controlled.

The AGC drive circuit comprises $R_{bp2}$, $R_{bp}$, $C_{bp}$, $C_{AGC}$, $R_{AGC}$, MESFET Q10 and Q11, and diode D7. The voltage output from the second gain stage, $V_b$ is fed to the gate of Q11. Q10, Q11, and D7 functions to provide control voltages that corresponds to Vb to the gates of MAGC1 and MAGC2.

In the AGC drive circuit, diode D7 is utilized to ensure $V_c$ is at least lower than $V_b$ by a diode bias voltage so that both MAGC1 and MAGC2 are turned off under low input current at the input terminal. RAGC and CAGC forms a single pole low-pass filter to provide, via Rbp and Cbp, an average value of Vc to the gate of MAGC1.

Rbp and Cbp forms a single pole bootstrapping circuit which helps to maintain a wide bandwidth and low pulse width distortion, which is discussed in detail in the subsequent paragraphs of this application.

The gate of MAGC2 is connected to the gate of MAGC1 via resistor Rbp2. MAGC2 functions to reduce the voltage gain of the first stage by reducing the load impedance seen by the high output impedance by MESFET Q1.

Figure 3:
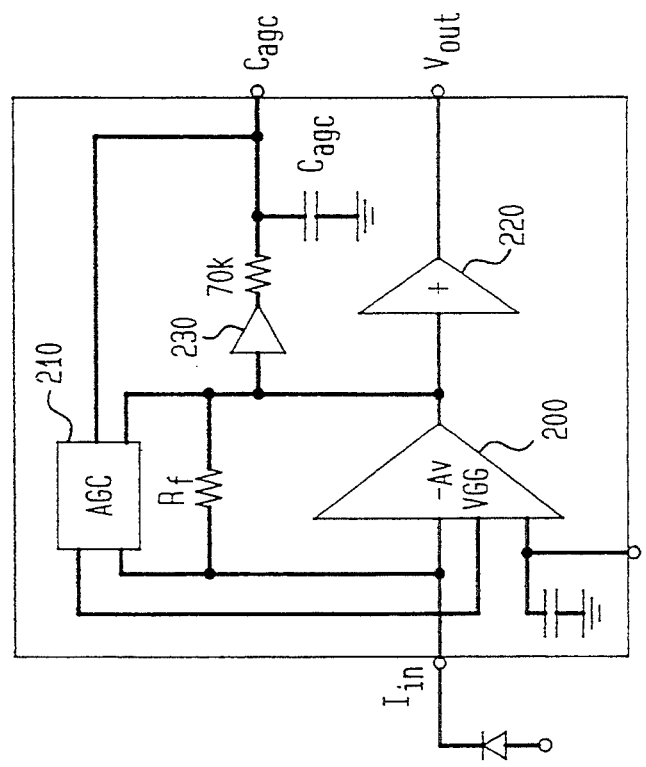
FIG. 3 depicts a functional block diagram for the circuit of FIG. 2.

The functional block diagram of this ATCA circuit is depicted in FIG. 3 of the drawings wherein the designation 200, 210, 220, and 230 refer to the circuit portion designated with the same numbers in FIG. 2.

This ATCA operates by applying an input current generated by PIN photo diode 201. Preferably, the photodiode is connected to the input terminal in such a way that the current from the photodiode has a direction that is outward from the input terminal. If the input current $I_{in}$ is low, Vb is low and it is approroximately the same potential as Va. Since Vc is lower than Vb by an diode bias voltage, the gate-to-source voltage for both MAGC1 and MAGC2 are negative; As a result, both MAGC1 and MAGC2 are turned off. Under this condition, the effective feedback resistance of the ATCA is approximately the value of Rf, and the ATCA operates as if it has a fixed feedback resistor Rf. Consequently, both gain stages provides maximum voltage gain at their output nodes, and the ATCA displays wide bandwidth and high sensitivity. As the average optical power increase, the average input current Iin increases, which cause Vb and Vc to increase with respect to Va, and MAGC1 and MAGC2 begin to be turned on. Consequently, the effective feedback resistance is reduced simultaneously as the voltage gain of each gain stage is reduced. The reduction of the gain and the effective feedback resistance decrease the output voltage swing of the ATCA, thus increasing the dynamic range of the ATCA.

Under high input current condition, although the sensitivity of the ATCA is reduced due to the reduction of the effective feedback resistance, the bit-error-rate of the ATCA dose not significantly increase because the high input current compensated the effect of reduced sensitivity.

Figure 4:
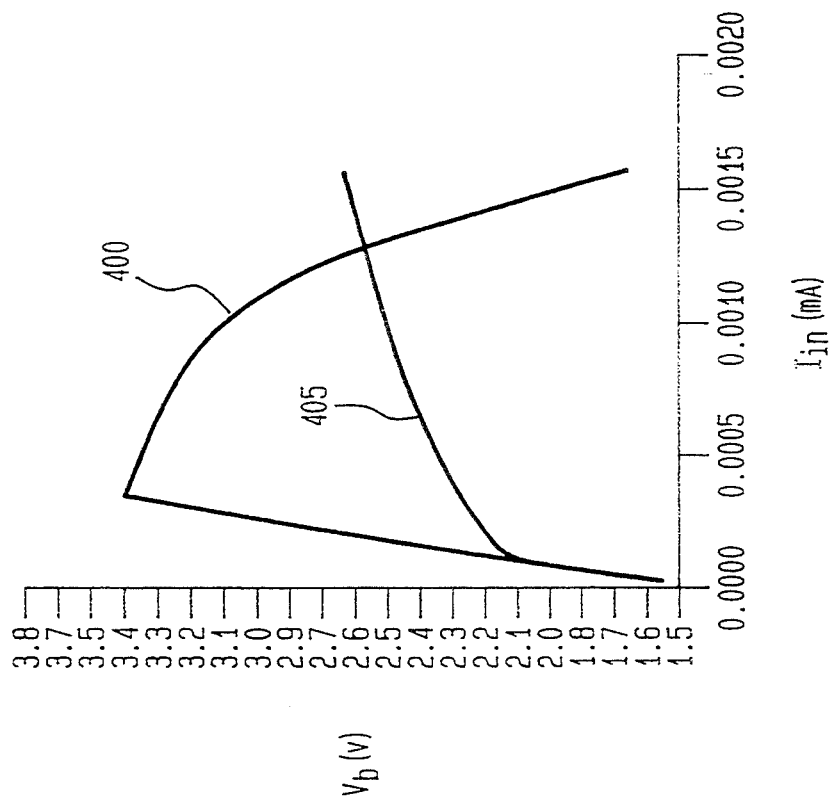
FIG. 4 depicts the comparison of output v input characteristics for an ATCA circuit with an AGC circuit and a TIA circuit without AGC circuit.

The effect of increased dynamic range for the ATCA of the present invention as compared with conventional TIA with fixed feedback resistance is illustrated in FIG. 4. In this drawing, the y-axis represents the open loop output voltage at the output of the second stage, Vb, in volts; the x-axis corresponds to an input dc current.

Both curves are generated from the results of computer simulations using SPICE II program. Curve 405 is obtained using the ATCA circuit of FIG. 2, whereas curve 400 is obtained from the same circuit of FIG. 2 except without the AGC circuit portion that consists of MAGC1, MAGC2, Rbp, Rbp2, RAGC, Cbp, and CAGC.

Curves 400 shows that the output voltage of the circuit without the AGC circuit collapses at an input current of about 300 μA. This is because that, without the AGC feedback circuit, the output voltage from the second gain stage, Vb, goes up to 3.5 volts at input current of 300 μA. With Vb approaches 3.5 V and considering that the voltage drops on diodes D3 and D4, and that the power supply VDD is at +5 V with respect to the ground potential, the potential at the source of Q7 approached 5 V, which causes Vb to collapse.

By comparison, as exhibited by curve 405, the circuit with the AGC circuit can provide proper voltage output with input current up to 1500 μA. This is due to AGC circuit which causes the reduction of the effective feedback resistance and the gain of both gain stages, which effectively controls the output voltage from the second stage below 2.7 V. Considering that the output voltage Vb is about 1.5 V at minimal input current, the peak to peak voltage swing is controlled to be within around 1 V in this circuit.

Figure 5A:
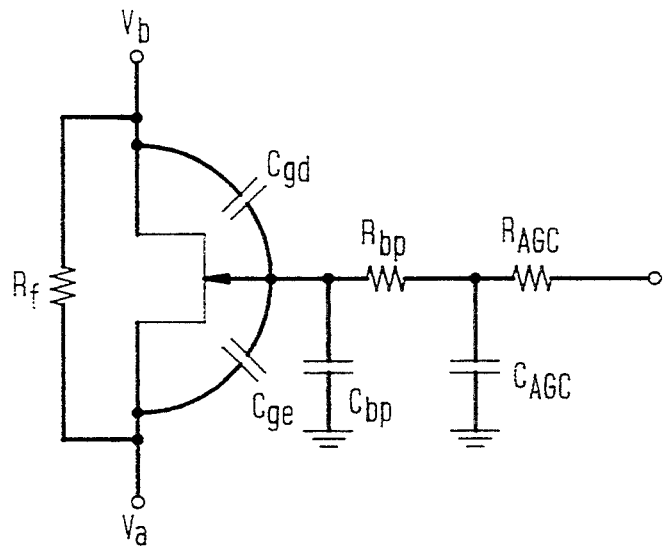
FIGS. 5a–b illustrates a bootstrapping circuit and its small signal equivalent circuit, respectively.

As depicted in FIG. 5a, resistor Rbp and capacitor Cbp, each of which has one terminal connected to the gate of MAGC1, form a bootstrapped circuit which functions to isolate the influence of the input dynamic signal on the transimpedance of MAGC1. Cgs and Cgd in this Figure are the gate-to-source, and gate-to-drain capacitance of the MESFET MAGC1, respectively. Resistor Rbp floats the gate of MAGC1 with respect to low frequency input at node 154 so that a portion of the ac input signal Va is able to be superimposed on the gate via Cgs and Cgd. As a result, the gate of MAGC1 partially follows the ac input node Va, which allows the transimpedance of MAGC1 be substantially independent of pulse width distortions at Va.

Figure 5B:
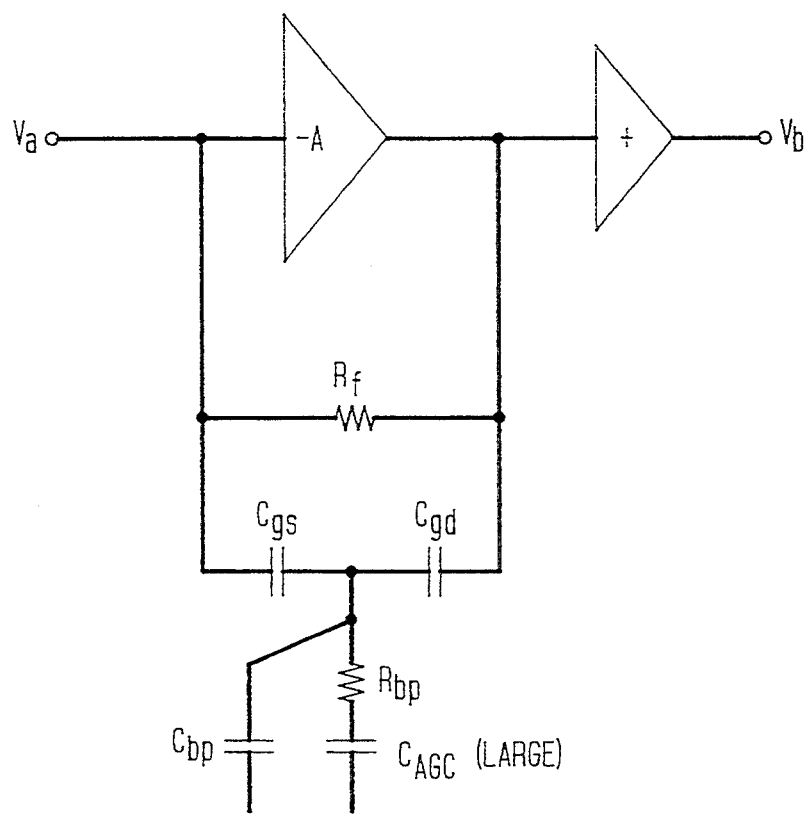

FIG. 5b shows a small signal equivalent of AGC FET, MAGC1, including the $C_{gd}$ and $C_{gs}$ of MAGC1. Ragc and Cagc form a low pass filter to provide an average value of the output signal to the resistor Rbp. Rbp isolates or floats the gate of MAGC1 AC wise via the bootstrapping effect of $C_{gd}$ and $C_{gs}$.

Figure 6:
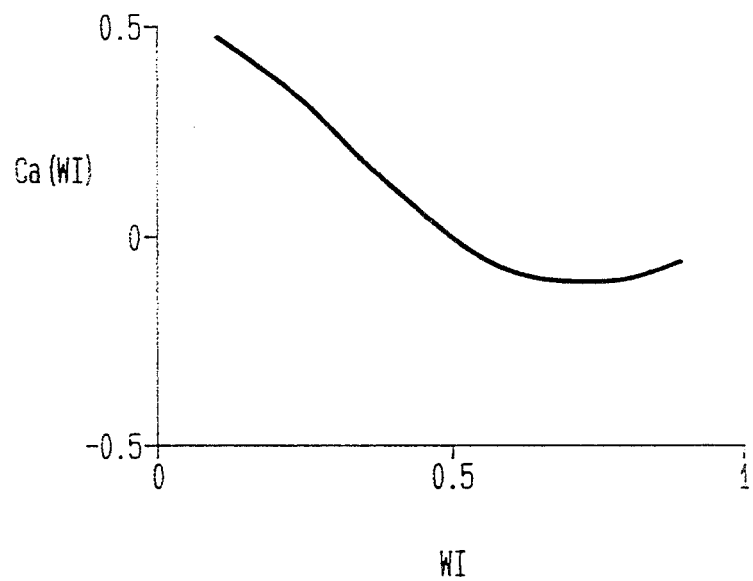
FIG. 6 refers to the effect of pulse width distortion.

FIG. 6 depicts the effect that pulse width distortion (W/T ratio not equal to 0.5, W is pulse width, and T is pulse period) has on the relative level of the second harmonic ($C_n$) to the fundamental frequency (amplitude of 1.0).

Figure 7:
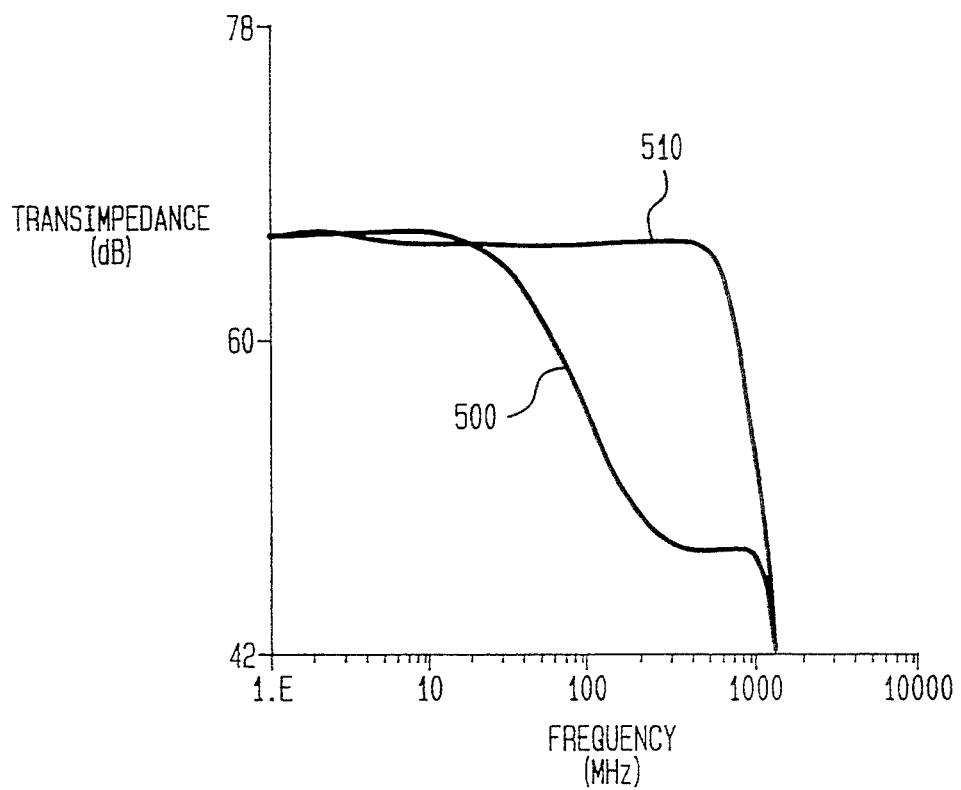
FIG. 7 refers to the effect of the bootstrapping circuit on the bandwidth of the ATCA.

Referring to FIG. 7, Cbp is the key element added to this design to bypass the input pole created by $C_{gs}$*Rbp under high input current conditions, since the value of $C_{gs}$ increases when the $V_{gs}$ of MAGC1 increases. FIG. 7 illustrate the reduction of transimpedance bandwidth under high input current conditions with and without Cbp.

To prevent the TIA from oscillating when the value of feedback resistance is reduced via MAGC1 (and concurrently with increased feedback comes reduced phase margin) two things must occur: first the open loop amplifier phase delay must not increase, and second, the phase margin of the closed loop amplifier must not become negative. In the ATCA these criteria are met by decreasing the gain of both the first gain stage (Q1-Q2) and the second gain stage (Q4-Q8) simultaneously. MAGC2 decreases the gain of the first stage by loading (adding resistance) in parallel with the Rd of Q1 and effectively reducing the GmRd products of Q1. The gain of the second stage is reduced by a similar action of the drain of Q6.

Figure 8:
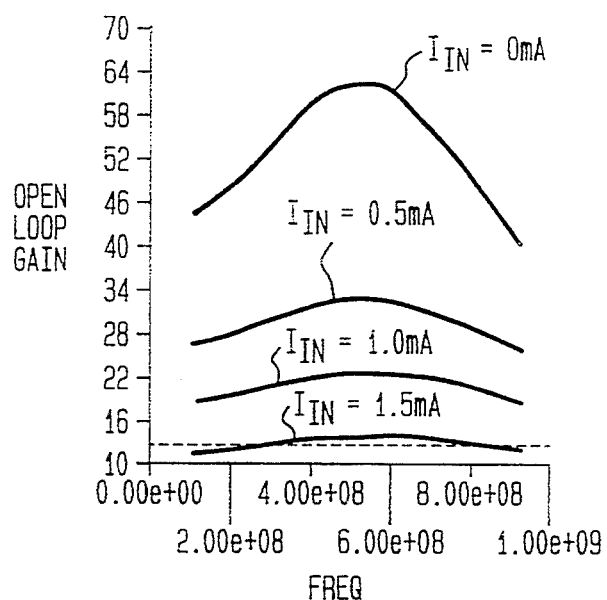
FIG. 8 illustrates open loop gain of the circuit of FIG. 2 at different input current.

The automatic open loop gain reduction effect is shown in FIG. 8 for input currents up to 1.5 mA. In this figure the open loop gain decreases from a maximum of 60 (OmA input current) to a minimum of 10 (1.5 mA input current).

Figure 9:
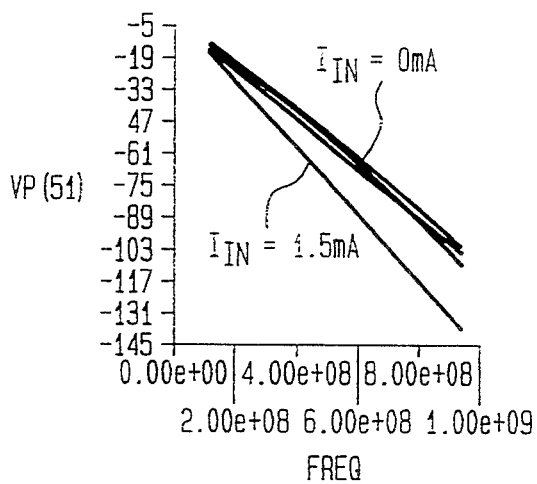
FIG. 9 depicts the open loop phase response of the circuit of FIG. 2.

The open loop phase response is shown in FIG. 9, where the y axis is the phase of Vb in degrees. It is evident that the phase margin remains more positive than −180° (phase margin less than −180° would produce positive feedback and oscillation).

Figure 10:
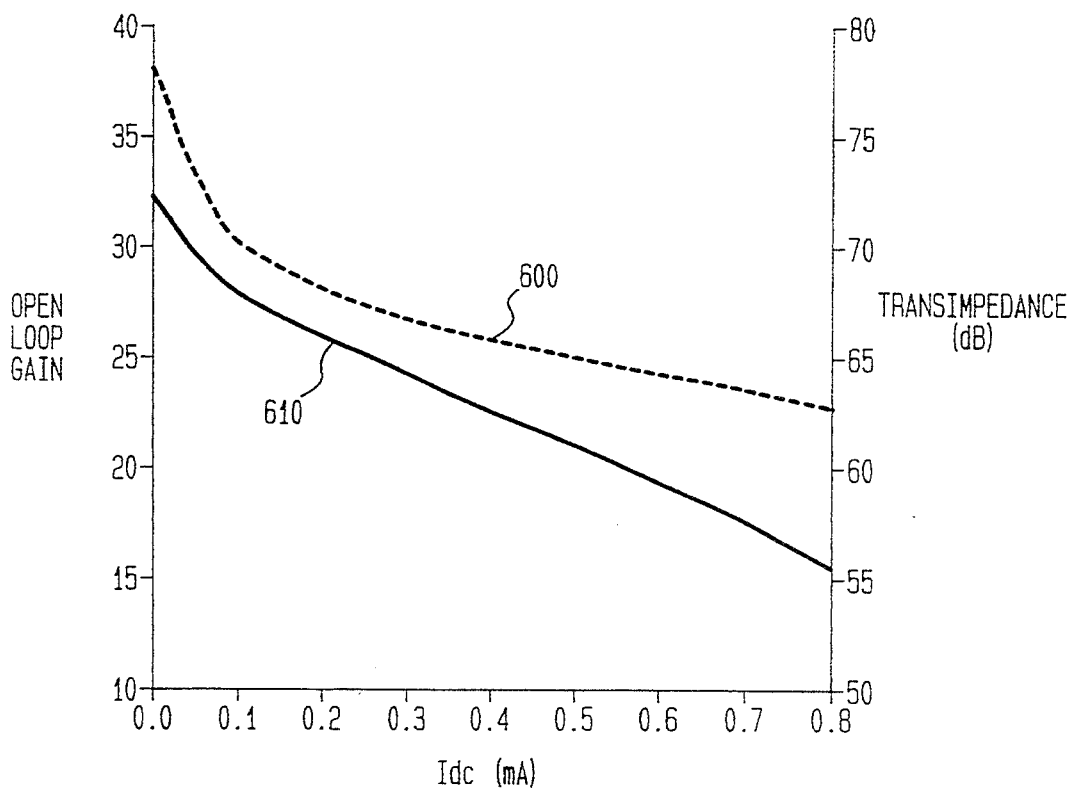
FIG. 10 illustrates the open loop gain and transimpedance v. the input current.

FIG. 10 shows how the effective transimpedance (curve 600) and open loop gain (curve 610) decrease as a function of the average input current Iin.

Figure 11:
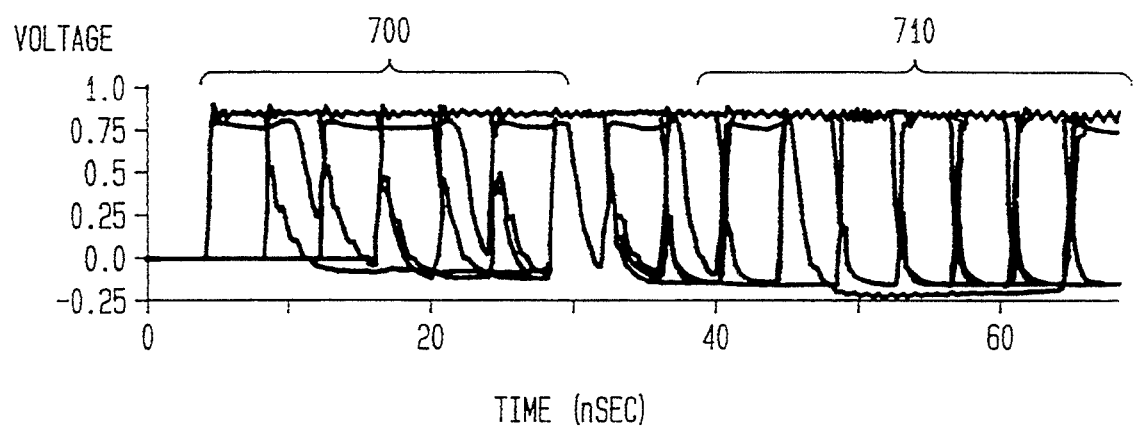
FIG. 11 illustrates eye diagrams for ATCA and TIA.

FIG. 11 shows an eye diagram generated with the ATCA circuit (portion 710) and without the ATCA circuit (portion 700). From this figure it is evident that there is severe pulse width distortion in the TIA without the ATCA components connected.

Figure 12:
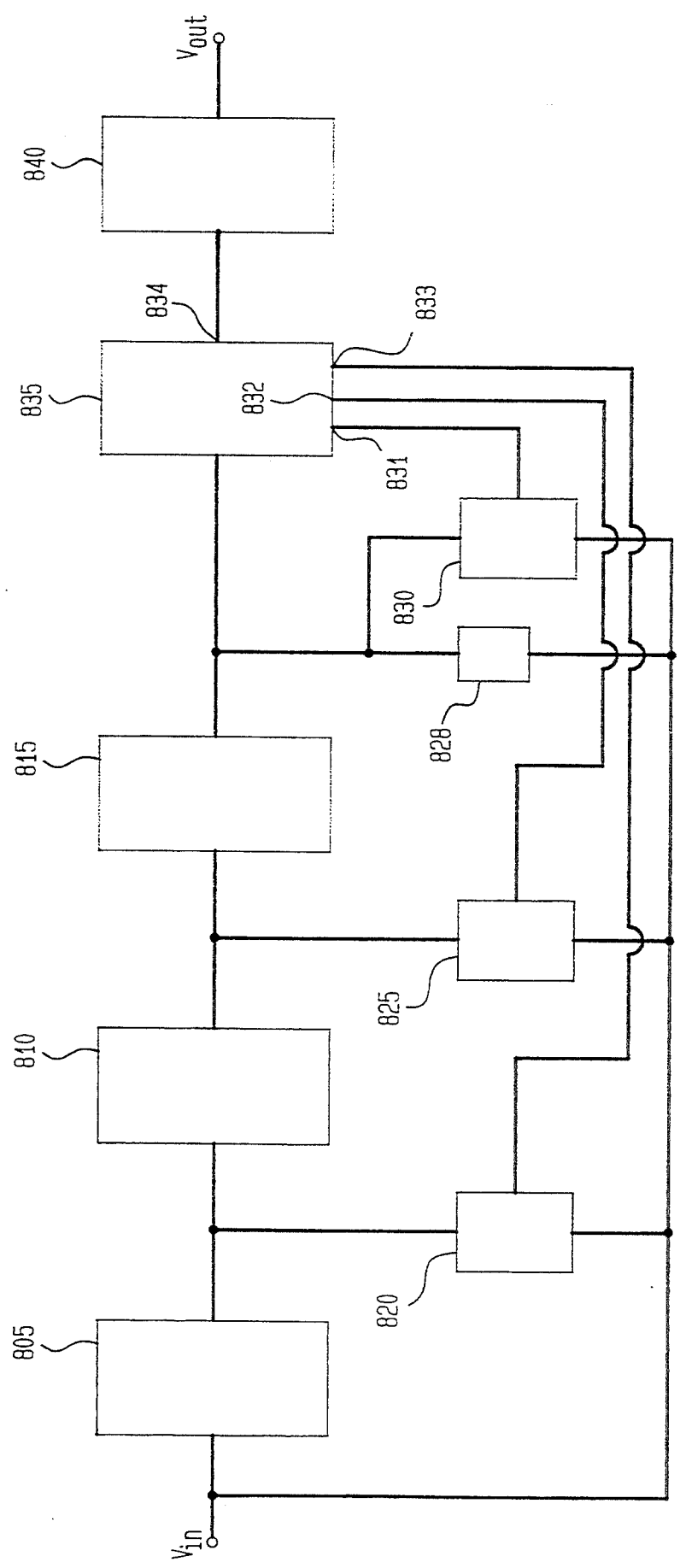
FIG. 12 illustrates the schematic block diagram of a second embodiment of the present invention.

FIG. 12 illustrates a schematic block diagram of a second embodiment of the present invention. This ATCA comprises three inverting gain stages 805, 810, and 815 connected in cascade, an AGC drive circuit 835, and a buffered output circuit 840. The ATCA further comprises a resistive feedback means 828 connected between the output node of the third gain stage and the input terminal of the ACTA. Additionally, the ATCA includes three variable resistance means 820, 825, and 830 which connects the output of gain stages 805, 810, and 815 to the input terminal, respectively. Three output nodes, 831, 832, and 834 are connected to the three control terminals of the variable resistance means. A buffer circuit 840 is attached to an output node 834 of the AGC drive circuit to drive the external transmission lines.

Preferably, each of the inverting stage is the inverting stage of the circuit illustrated in FIG. 2, and each of the variable resistance means is a AGCFET. The AGC drive circuit of this embodiment can be similarly formed as the one in the circuit of FIG. 2.

This operation principle of this ATCA circuit is similar to that for the circuit of FIG. 2. The transimpedance and the gain at each stage are simultaneously and automatically adjusted according to the amplitudes of input signals.

As will be apparent to those skilled in the art, numerous modifications may be made within the scope of the invention, which is not intended to be limited except in accordance with the following claims.

What is claimed is:

1. An automatic transimpedance amplifier comprising:

an inverting voltage amplifier,
said voltage amplifier comprising a plurality of voltage gain stages, each of said voltage gain stage having an output node and at least one input node, said gain stages being connected one after another from a first stage to a last stage as a cascade;
a feedback resistance means connecting said output node of said last stage to said input node of said first stage;
a plurality of variable resistance means,
each said means having first, second, and control terminals, the resistance between said first and second terminals being variable by applying an electronic signal to said control terminal,
each said variable resistance means being connected between said output node of one voltage gain stage and said input node of said first stage, with said first terminal of said variable resistance means being connected to said output node of said one stage, and said second terminal being connected to said input node of said first gain stage, whereby a voltage gain of said one stage being controlled by changing said resistance of said variable resistive means; and
an automatic gain control (AGC) drive circuit having an input node connected to the output node of said last stage, and a plurality of output control nodes, each control node being connected to said control terminal of one variable resistive means,
said AGC drive circuit being responsive to an output voltage at the output node of the last stage, generating at said output control terminals control signals relating to said output voltage,
said drive circuit being responsive to an increased current applied at said input node of said first stage, generating control signals that reduce the resistance of each variable resistance means, thereby reducing voltage gain of each stage as well as an effective feedback resistance.

2. The transimpedance amplifier of claim 1 wherein said voltage amplifier comprises three inverting voltage gain stage connected one after another as a cascade.

3. The transimpedance amplifier of claim 1 wherein said voltage amplifier comprises a first inverting voltage gain stage and a second non-inverting differential voltage gain stage, and said second gain stage further includes a second input node operatively connected to said input node of said first stage.

4. The transimpedance amplifier of claim 1 wherein said AGC drive circuit also functions as a buffer circuit, and said AGC drive circuit further includes an output terminal for providing a buffered output that correspond to said voltage at the output node of the last stage.

5. The transimpedance amplifier of claim 4 further comprises a second buffer circuit connected to said output terminal of said AGC drive circuit.

6. The transimpedance amplifier of claim 1 wherein said resistive feedback means is a resistor.

7. The transimpedance amplifier of claim 1 wherein said plurality variable resistive means are field effect transistors.

8. The transimpedance amplifier of claim 1 wherein said voltage amplifier, said variable resistance means and said automatic gain control (AGC) drive circuit comprise GaAs field effect transistors, and the transimpedance amplifier is a GaAs integrated circuit.

9. An automatic transimpedance control amplifier comprising:

a first inverting voltage gain stage having a first input node and a first output node;

a second non-inverting differential voltage gain stage having a second input node operatively connected to said first output node, a third input node connected to said first input node, and a second output node;

a resistive feedback means connecting said second output node to said first input node;

a first variable resistance means parallel connected to said resistive feedback means, said first variable resistance means having a first terminal connected to said second output node, a second terminal connected to said first input node, and a control terminal, the resistance between said first and second terminals being variable by applying an electronic signal to said control terminal, said first variable resistance forming with said resistive means an effective resistive feedback means having effective feedback resistance;

a second variable resistance means connecting said first output node to said first input node, said second variable resistance means having a first terminal connected to said first output node, a second terminal connected to said first input node, and a control terminal, the resistance between said first and second terminals being variable by applying an electronic signals to said control terminal; and an automatic gain control (AGC) drive circuit having an input node operatively connected to said second output node, a first output control node connected to said control terminal of said first variable resistance means, a second output control node connected to said control terminal of said second variable resistance means, said AGC drive circuit developing at said output control nodes control signals related to an output voltage appearing on said second output node, said AGC drive circuit generating control signals to reduce the resistance of said first and second variable resistance means in response to an increase of an input current applied at said first input node, thereby reducing the voltage gains of said first and second voltage gain stages as well as reducing the effective feedback resistance.

10. The transimpedance amplifier of claim 9 wherein said AGC drive circuit also functions as a buffer circuit, and said AGC drive circuit further includes an output terminal for providing a buffered output that correspond to said voltage at the output node of the second stage.

11. The transimpedance amplifier of claim 9 further comprises a second buffer circuit connected to said output terminal of said AGC drive circuit.

12. The transimpedance amplifier of claim 9 wherein said resistive feedback means is a resistor.

13. The transimpedance amplifier of claim 9 wherein said variable resistive means are field effect transistors.

14. The transimpedance amplifier of claim 9 wherein said voltage amplifier, said variable resistance means and said automatic gain control (AGC) drive circuit comprise GaAs field effect transistors, and the transimpedance amplifier is a GaAs integrated circuit.

* * * * *